US012733528B2

(12) United States Patent
Nakajima

(10) Patent No.: US 12,733,528 B2
(45) Date of Patent: Sep. 8, 2026

(54) MANUFACTURING METHOD FOR SEMICONDUCTOR DEVICE

(71) Applicant: FUJI ELECTRIC CO., LTD., Kawasaki (JP)

(72) Inventor: Tsunehiro Nakajima, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 675 days.

(21) Appl. No.: 17/975,462

(22) Filed: Oct. 27, 2022

(65) Prior Publication Data

US 2023/0207517 A1 Jun. 29, 2023

(30) Foreign Application Priority Data

Dec. 23, 2021 (JP) ................................ 2021-209653

(51) Int. Cl.
*H10W 72/00* (2026.01)
*H10W 72/30* (2026.01)

(52) U.S. Cl.
CPC ..... *H10W 72/073* (2026.01); *H10W 72/0198* (2026.01); *H10W 72/013* (2026.01); (Continued)

(58) Field of Classification Search
CPC ......... H01L 24/83; H01L 24/97; H01L 24/29; H01L 24/73; H01L 24/92; H01L 24/32; H01L 2224/29199; H01L 2224/29339; H01L 2224/29347; H01L 2224/83022; H01L 2224/83026; H01L 2224/83048; H01L 2224/83201; H01L 2224/8384; H10W 72/073; H10W 72/0198; H10W 72/013; H10W 72/01365;
(Continued)

(56) References Cited

U.S. PATENT DOCUMENTS

2011/0012262 A1* 1/2011 Morita .................... H01L 24/83
257/E23.068
2017/0294395 A1* 10/2017 Happoya ........... H01L 23/49582

FOREIGN PATENT DOCUMENTS

JP 2008-208442 A 9/2008
JP 2013-159830 A 8/2013
(Continued)

*Primary Examiner* — Leonard Chang
*Assistant Examiner* — Stanetta D Isaac
(74) *Attorney, Agent, or Firm* — Rabin & Berdo, P.C.

(57) ABSTRACT

A semiconductor device manufacturing method, including: a first treatment process for reducing an amount of oxygen and carbon adsorbed to a main surface of the conductive plate to 20 atomic % or less; a first checking process for checking whether the conductive plate has a temperature no higher than a reference temperature; a chip placement process for placing, responsive to the conductive plate having the temperature no higher than the reference temperature, a semiconductor chip on the main surface of the conductive plate via a sinter material; a first bonding process for applying heat and pressure to the sinter material according to a first condition that allows the organic substance to partially remain; a preparatory process for making preparations for further bonding the semiconductor chip; and a second bonding process for further applying heat and pressure to the sinter material according to a second condition that sinters the sinter material.

13 Claims, 11 Drawing Sheets

(52) U.S. Cl.
CPC ............................ *H10W 72/01365* (2026.01); *H10W 72/01371* (2026.01); *H10W 72/07311* (2026.01); *H10W 72/07331* (2026.01); *H10W 72/07332* (2026.01); *H10W 72/30* (2026.01); *H10W 72/325* (2026.01); *H10W 72/351* (2026.01); *H10W 72/352* (2026.01)

(58) Field of Classification Search
CPC ..... H10W 72/01371; H10W 72/07311; H10W 72/07331; H10W 72/07332; H10W 72/30; H10W 72/325; H10W 72/351; H10W 72/352; H10W 72/851; H10W 99/00
See application file for complete search history.

(56) References Cited

FOREIGN PATENT DOCUMENTS

| | | | |
|---|---|---|---|
| JP | 2015-099917 | A | 5/2015 |
| JP | 2015-178424 | A | 10/2015 |

* cited by examiner

MANUFACTURING METHOD FOR SEMICONDUCTOR DEVICE

CROSS-REFERENCE TO RELATED APPLICATION

This application is based upon and claims the benefit of priority of the prior Japanese Patent Application No. 2021-209653, filed on Dec. 23, 2021, the entire contents of which are incorporated herein by reference.

BACKGROUND OF THE INVENTION

1. Field of the Invention

The embodiments discussed herein relate to a manufacturing method for a semiconductor device.

2. Background of the Related Art

There is a known technique for bonding a pair of substrates each having metal regions by performing a thermal reduction treatment on surfaces of the metal regions of at least one of the substrates to thereby form fine metal particles on the surfaces of the metal regions and heating the paired substrates with the surfaces of the metal regions in contact with each other (Japanese Laid-open Patent Publication No. 2015-99917). In relation to this technique, it is suggested to reduce a copper oxide layer across the surface of each metal region using formic acid; to remove copper oxide from the surface of the oxide layer by hydrogen radicals decomposed from formic acid on a platinum catalyst and form fine copper particles by the reaction between a formic acid group and cuprous oxide beneath the copper oxide; and to bring the surfaces with the fine metal particles formed thereon into contact with each other and cause a growth of the fine metal particles by sintering or the like.

There is another known technique for placing a metal substrate on a ceramic substrate via a brazing material including a brazing filler metal powder and an organic binder; bonding the metal substrate to the ceramic substrate via the brazing material by heating; removing adhering substances containing carbon as a main component by heating in an atmosphere including oxygen; and then removing oxide from the surface of the metal substrate by immersing the bonded substrates in a chemical containing sulfuric acid or the like (Japanese Laid-open Patent Publication No. 2015-178424).

There are also known techniques for placing a copper disk on the surface of a copper plate via a metal nanoparticle paste and then bonding the copper plate and the copper disk by heating and pressurizing under a nitrogen atmosphere and for preparing the copper plate and the copper disk before use by first electropolishing them in a mixed solution of phosphoric acid and sulfuric acid to remove surface oxide and then purging them with distilled water (Japanese Laid-open Patent Publication No. 2013-159830).

There is yet another known technique for bonding members by forming, at the bonding interface of the members, an oxide layer containing oxygen; placing, at the bonding interface, a bonding material containing metal compound particles having a predetermined particle size and a reducing agent composed of organic substances; and heating and pressurizing the bonding interface to thereby remove the organic substances through combustion with oxygen present in the bonding interface, and form metal particles having a predetermined particle size due to reduction of the metal compound particles and sinter the metal particles together (Japanese Laid-open Patent Publication No. 2008-208442).

There is a known semiconductor device having a structure in which a semiconductor chip is mounted, via a sinter material based on silver or copper, on a main surface of a conductive plate, such as a conductive pattern layer or a lead frame, of an insulated circuit board. In manufacturing such a semiconductor device, for example, first, the semiconductor chip is placed on the main surface of the conductive plate via the sinter material containing organic substances and temporarily bonded under a first heating and pressurizing condition. Then, after a preparatory step, such as transportation of the conductive plate (the insulated circuit board or the lead frame) to which the semiconductor chip is temporarily bonded, the sinter material is sintered under a second heating and pressurizing condition. Herewith, the semiconductor chip is definitively bonded to the conductive plate via the sinter material.

It is sometimes the case that a certain amount or more of oxygen and carbon contained in an environment where the conductive plate and the like are handled is adsorbed to a surface onto which the sinter material adheres, e.g., the main surface of the conductive plate. When this happens, the adhesion of the sinter material may be reduced, which may cause the semiconductor chip to be shifted in position during the period from the placement of the semiconductor chip on the conductive plate through the temporary bonding in the lead up to the definitive bonding. Bonding of the displaced semiconductor chip may create problems in subsequent connections (such as poor connections) between the semiconductor chip and other parts (e.g., conductive wires, clips, blocks, and circuit boards), thus possibly causing a decrease in the yield and quality of the semiconductor device.

SUMMARY OF THE INVENTION

According to an aspect, there is provided a semiconductor device manufacturing method including a first treatment process for providing a conductive plate having oxygen and carbon adsorbed to a main surface thereof, and reducing an amount of the oxygen and the carbon adsorbed to the main surface of the conductive plate to 20 atomic % or less; a first checking process for checking whether the conductive plate after the first treatment process has a temperature equal to or lower than a first reference temperature; a chip placement process for placing, responsive to the conductive plate having the temperature equal to or lower than the first reference temperature in the first checking process, a semiconductor chip on the main surface of the conductive plate via a sinter material containing an organic substance, such that the main surface of the conductive plate opposes a main surface of the semiconductor chip; a first bonding process for applying, after the chip placement process, heat and pressure to the sinter material according to a first condition that allows the organic substance to partially remain; a preparatory process for making, after the first bonding process, preparations for further bonding the semiconductor chip to the first main surface via the sinter material; and a second bonding process for further applying, after the preparatory process, heat and pressure to the sinter material according to a second condition that sinters the sinter material.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

(a) First Embodiment

Figure 1A:
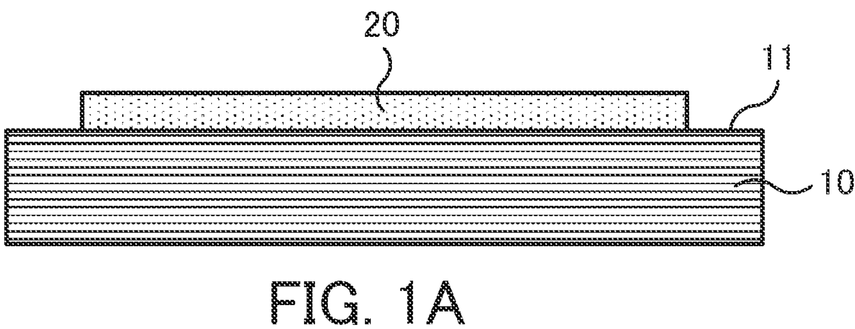
FIGS. 1A to 1C illustrate a first example of a semiconductor device manufacturing method.
Figure 1B:
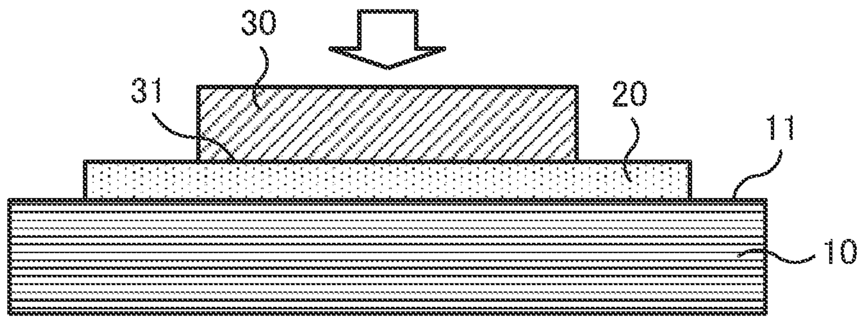
Figure 1C:
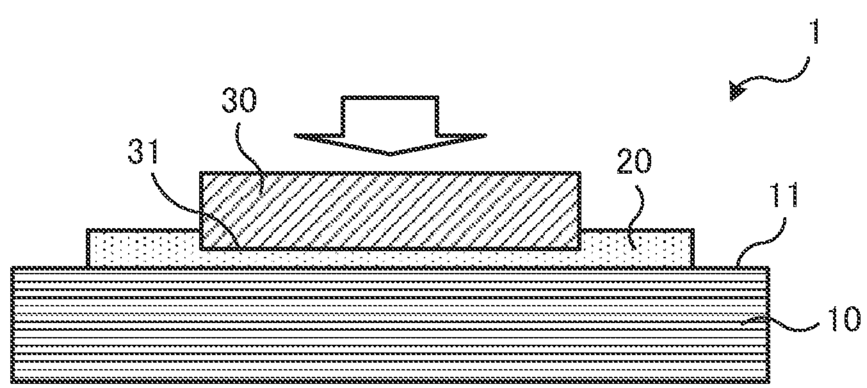

FIGS. 1A to 1C illustrate a first example of a semiconductor device manufacturing method. FIG. 1A is a schematic cross-sectional view with relevant parts of an example of a step for forming a paste-like sinter material. FIG. 1B is a schematic cross-sectional view with relevant parts of an example of a step for placing a semiconductor chip (chip placement step) and a step for temporarily bonding the semiconductor chip (first bonding step). FIG. 1C is a schematic cross-sectional view with relevant parts of an example of a step for definitively bonding the semiconductor chip (second bonding step).

In the first example, a paste-like sinter material 20 is formed on a first main surface 11 of a conductive plate 10, as illustrated in FIG. 1A. The conductive plate 10 is, for example, a conductive pattern layer of an insulated circuit board in which the conductive pattern layer is formed on the main surface of an insulated substrate, such as a ceramic substrate. Alternatively, the conductive plate 10 may be a die pad provided on a lead frame. A direct copper bonding (DCB) substrate or an active metal brazed (AMB) substrate is, for example, used as the insulated circuit board. A metal material, such as copper and aluminum, is used for the conductive pattern layer of the insulated circuit board, and the lead frame or the die pad thereof.

The paste-like sinter material 20 contains an organic solvent and particles of metal, such as silver or copper, each coated with an organic protective film. As for materials for the metal particles of the sinter material 20, silver exhibits higher resistance to oxidation compared to copper while copper is less expensive than silver. The paste-like sinter material 20 is an example of a sinter material containing organic substances (an organic solvent and organic protective films). The paste-like sinter material 20 containing metal particles, such as silver particles, and organic substances covering the metal particles is applied to the first main surface 11 of the conductive plate 10 provided in an insulated circuit board or lead frame, by using, for example, a metal mask or a screen mask, and thus formed on the first main surface 11.

As illustrated in FIG. 1A, the paste-like sinter material 20 formed on the first main surface 11 of the conductive plate 10 is dried at a predetermined temperature, e.g., about 140° C. to thereby volatilize the organic solvent to some extent, and then forms a fixed shape.

Subsequently, a semiconductor chip 30 is placed on the paste-like sinter material 20 formed on the first main surface 11 of the conductive plate 10, as illustrated in FIG. 1B. As the semiconductor chip 30, a semiconductor chip, such as an insulated gate bipolar transistor (IGBT) or a metal oxide semiconductor field effect transistor (MOSFET), is used. Alternatively, a power semiconductor chip using a wide band gap semiconductor, such as silicon carbide (SiC), is used. An electrode layer is provided on a second main surface 31 of the semiconductor chip 30, which opposes the first main surface 11 of the conductive plate 10. The electrode layer made of a metallic material, such as copper, serves as a load electrode, for example, a collector electrode or a drain electrode. The semiconductor chip 30 is placed on the sinter material 20 such that the second main surface 31 opposes the first main surface 11 of the conductive plate 10 and the sinter material 20.

The semiconductor chip 30 on the sinter material 20 is pressurized toward the sinter material 20 and the conductive plate 10, as illustrated in FIG. 1B, while being heated. The heating and pressurizing conditions at this time are set according to a first condition which allows part of the organic substances contained in the sinter material 20 (e.g., the organic protective films coating the metal particles, such as silver particles, and part of the organic solvent) to remain. By heating and pressurizing according to the first condition, the semiconductor chip 30 is temporarily bonded (or temporarily fixed) to the first main surface 11 of the conductive plate 10 via the sinter material 20 with part of the organic substances remaining therein.

The semiconductor chip 30 temporarily bonded to the first main surface 11 of the conductive plate 10 via the sinter material 20 undergoes a predetermined preparatory step for definitive bonding, such as transportation, and is then pressurized toward the sinter material 20 and the conductive plate 10, as illustrated in FIG. 1C, while being further heated. The heating and pressurizing conditions at this time are set according to a second condition which removes the organic substances contained in the sinter material 20 and sinters the metal particles (e.g., silver particles) together. The heating temperature of the second condition is set higher than that of the first condition for the temporary bonding, and the applied pressure of the second condition is also set higher than that of the first condition. By heating and pressurizing according to the second condition, the semiconductor chip 30 is bonded (or definitively bonded) to the first main surface 11 of the conductive plate 10 via the sinter material 20 thus sintered.

For example, by means of the method illustrated in FIGS. 1A to 1C, the semiconductor device 1 is obtained in which the semiconductor chip 30 is mounted on the first main surface 11 of the conductive plate 10 via the sinter material 20.

Note that, in the method using the paste-like sinter material 20, the paste-like sinter material 20 is applied to the first main surface 11 of the conductive plate 10 (FIG. 1A) in such a manner as to have a planar size larger than that of the second main surface 31 of the semiconductor chip 30 in consideration of possible formation of raised edges or points called dog ears and sag taking place at the start of application. In addition, the method using the paste-like sinter material 20 entails supply of a sufficient amount of the paste of the sinter material 20 to the mask used in the application. Because part of the paste-like sinter material 20 is used to fill openings of the mask, the actual amount of the paste used remains in the range between about 80% to about 50%.

Figure 2A:
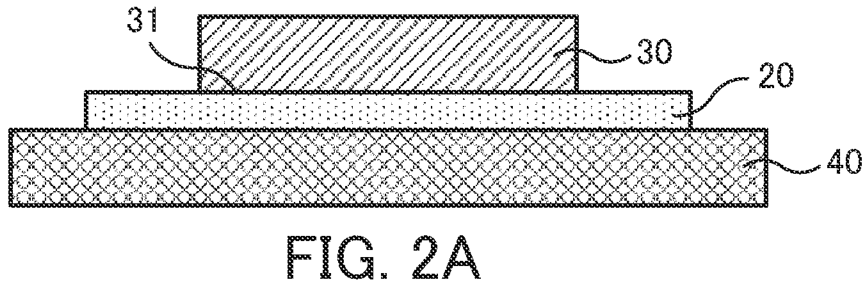
FIGS. 2A to 2D illustrate a second example of the semiconductor device manufacturing method.
Figure 2B:
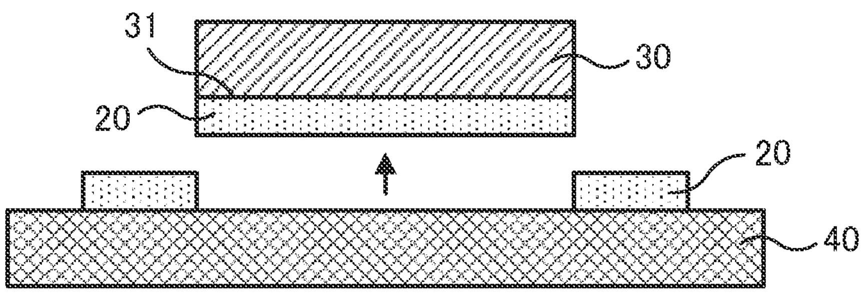
Figure 2C:
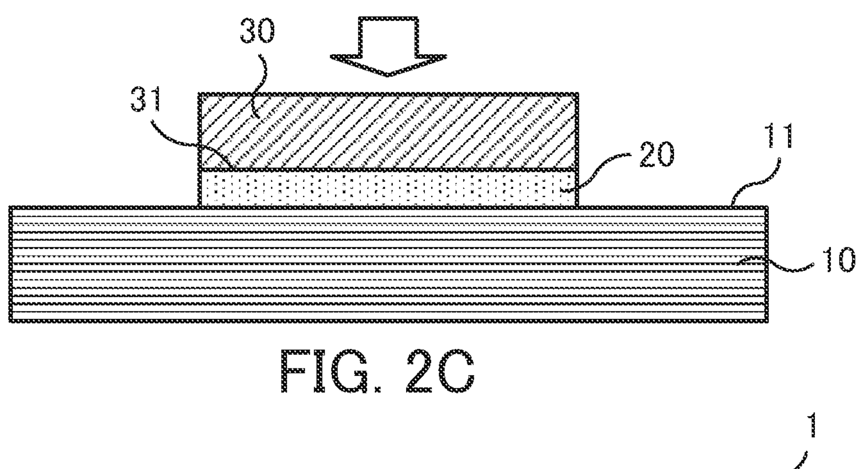
Figure 2D:
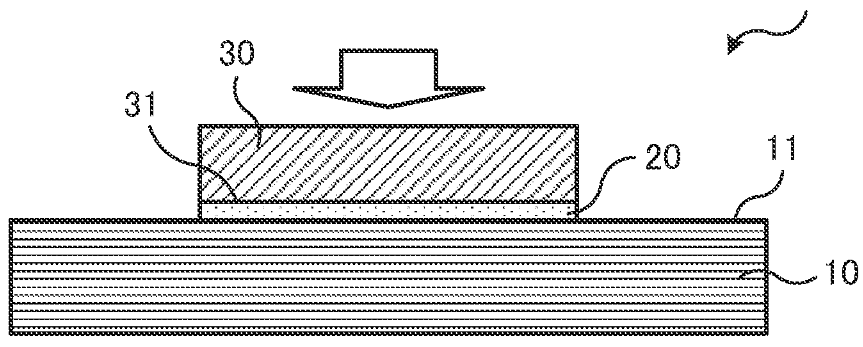

FIGS. 2A to 2D illustrate a second example of the semiconductor device manufacturing method. FIG. 2A is a schematic cross-sectional view with relevant parts of an example of a step for placing a semiconductor chip on a sheet-like sinter material. FIG. 2B is a schematic cross-sectional view with relevant parts of an example of a step for transferring the sheet-like sinter material to the semiconductor chip. FIG. 2C is a schematic cross-sectional view with relevant parts of an example of a step for placing the semiconductor chip with the sheet-like sinter material transferred thereto (chip placement step) and a step for temporarily bonding the semiconductor chip (first bonding step). FIG. 2D is a schematic cross-sectional view with relevant parts of an example of a step for definitively bonding the semiconductor chip (second bonding step).

In the second example, a sheet-like sinter material 20 is placed on a support 40, which is, for example, a rubber sheet, as illustrated in FIG. 2A. The sheet-like sinter material 20 used here is a sinter material with a pre-fixed shape formed by applying the above-described paste-like sinter material 20 to a polyethylene terephthalate (PET) film or the like and drying it at a predetermined temperature to thereby volatilize the organic solvent to some extent. The sheet-like sinter material 20 is an example of a sinter material containing organic substances (an organic solvent and organic protective films). The sheet-like sinter material 20 is placed on the support 40.

As illustrated in FIG. 2A, the above-described semiconductor chip 30 is placed on the sheet-like sinter material 20 disposed on the support 40. The semiconductor chip 30 is placed on the sinter material 20 such that the second main surface 31, on which an electrode layer serving as a load electrode is provided, opposes the support 40 and the sinter material 20. The semiconductor chip 30 placed on the sinter material 20 is pressurized while being heated. Herewith, the sinter material 20 adheres (or is affixed) to the second main surface 31 of the semiconductor chip 30. Alternatively, (the second main surface 31 of) the semiconductor chip 30 adheres onto the sinter material 20.

Subsequently, the sinter material 20 on the support 40 is broken at a position corresponding to the size of the semiconductor chip 30, as illustrated in FIG. 2B, and the semiconductor chip 30 with the sinter material 20 affixed to the second main surface 31 and thus transferred thereto is picked up.

Then, the picked up semiconductor chip 30 and sinter material 20 are placed on (or adhere onto or are affixed onto) the first main surface 11 of the conductive plate 10, as illustrated in FIG. 2C. Specifically, the semiconductor chip 30 and the sinter material 20 are placed on the first main surface 11 such that the sinter material 20 transferred to the second main surface 31 of the semiconductor chip 30 opposes the first main surface 11 of the conductive plate 10.

The semiconductor chip 30 disposed on the first main surface 11 of the conductive plate 10 via the sinter material 20 is pressurized toward the sinter material 20 and the conductive plate 10, as illustrated in FIG. 2C, while being heated. The heating and pressurizing conditions at this time are set according to a first condition which allows part of the organic substances contained in the sinter material 20 (e.g., the organic protective films coating the metal particles, such as silver particles, and part of the organic solvent) to remain. By heating and pressurizing according to the first condition, the semiconductor chip 30 is temporarily bonded (or temporarily fixed) to the first main surface 11 of the conductive plate 10 via the sinter material 20 with part of the organic substances remaining therein.

The semiconductor chip 30 temporarily bonded to the first main surface 11 of the conductive plate 10 via the sinter material 20 undergoes a predetermined preparatory step for definitive bonding, such as transportation, and is then pressurized toward the sinter material 20 and the conductive plate 10, as illustrated in FIG. 2D, while being further heated. The heating and pressurizing conditions at this time are set according to a second condition which removes the organic substances contained in the sinter material 20 and sinters the metal particles (e.g., silver particles) together. The heating temperature of the second condition is set higher than that of the first condition for the temporary bonding, and the applied pressure of the second condition is also set higher than that of the first condition. By heating and pressurizing according to the second condition, the semiconductor chip 30 is bonded (or definitively bonded) to the first main surface 11 of the conductive plate 10 via the sinter material 20 thus sintered.

For example, by means of the method illustrated in FIGS. 2A to 2D, the semiconductor device 1 is obtained in which the semiconductor chip 30 is mounted on the first main surface 11 of the conductive plate 10 via the sinter material 20.

Note that, in the method using the sheet-like sinter material 20, a mechanism is adopted that transfers, to the second main surface 31 of the semiconductor chip 30, the sheet-like sinter material 20 having a planer size corresponding to that of the second main surface 31 (FIGS. 2A and 2B). This increases the efficiency in the use of the sinter material 20 to the range from about 80% to about 95%.

In the case of using the semiconductor chip 30 operating at relatively high temperatures, e.g., a power semiconductor chip using a wide band gap semiconductor, such as SiC, in the semiconductor device 1, if a solder material is used for bonding the semiconductor chip 30 to the conductive plate 10, the operating temperature of the semiconductor chip 30 may approach or exceed the melting point of the solder material, or no sufficient thermal conductivity between the semiconductor chip 30 and the conductive plate 10 may be obtained. On the other hand, the above-described sinter material 20 is one of the materials capable of achieving high heat resistance and thermal conductivity and therefore suitable to be used for bonding the conductive plate 10 and the semiconductor chip 30, which is, e.g., a power semiconductor chip using a wide band gap semiconductor operating at relatively high temperatures.

Further descriptions of the above-mentioned sinter material 20 and temporary and definitive bonding using the sinter material 20 are given next.

Figure 3A:
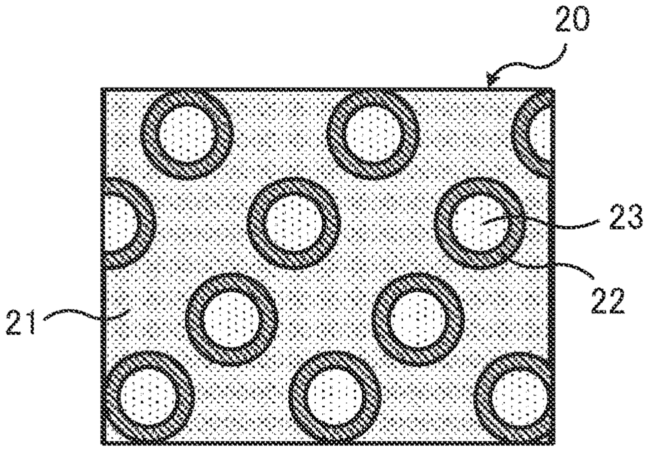
FIGS. 3A to 3C illustrate temporary and definitive bonding of a conductive plate and a semiconductor chip using a sinter material.
Figure 3B:
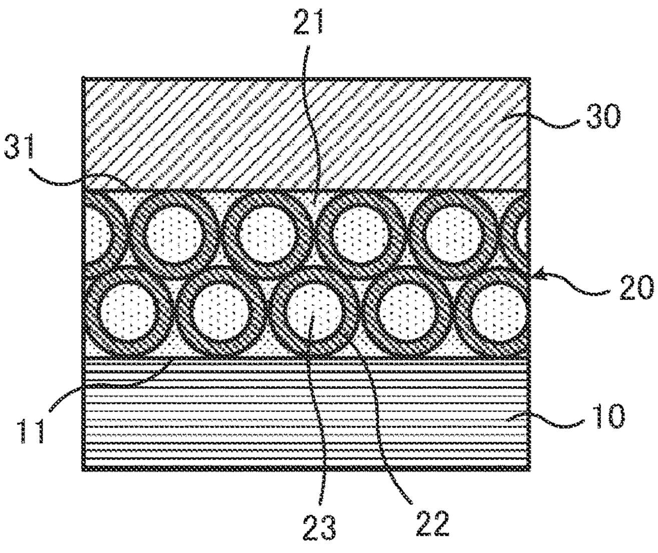
Figure 3C:
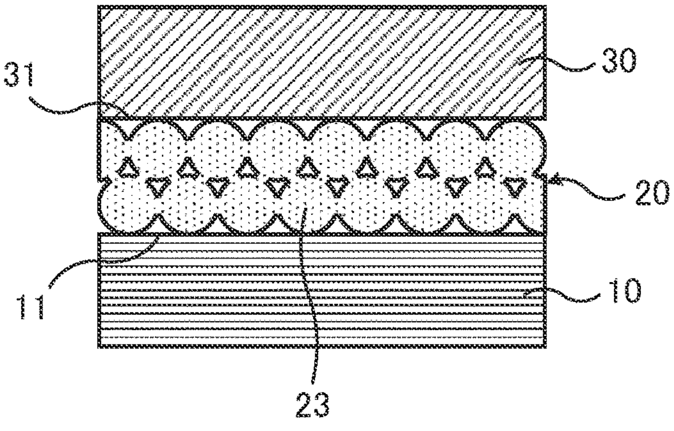

FIGS. 3A to 3C illustrate temporary and definitive bonding of a conductive plate and a semiconductor chip using a sinter material. FIG. 3A is a schematic cross-sectional view with relevant parts of an example of the sinter material. FIG. 3B is a schematic cross-sectional view with relevant parts of an example of a step for temporarily bonding the conductive plate and the semiconductor chip (first bonding step). FIG. 3C is a schematic cross-sectional view with relevant parts of an example of a step for definitively bonding the conductive plate and the semiconductor chip (second bonding step).

The paste-like sinter material 20 contains an organic solvent 21 and metal particles 23 of silver or the like, each coated with an organic protective film 22, as illustrated in FIG. 3A. Coating the metal particles 23 with the organic protective films 22 prevents oxidization of the metal particles 23. The metal particles 23 coated with the organic protective films 22 are mixed, for example, with about 10 percent by weight of the organic solvent 21 to be paste. The sinter material 20 is manufactured, stored, and used in the form of paste.

In the step for temporarily bonding the first main surface 11 of the conductive plate 10 and the second main surface 31 of the semiconductor chip 30 via the sinter material 20 (FIGS. 1B and 2C), heat and pressure according to the first condition are applied to the sinter material 20, in which part of the organic solvent 21 has been volatilized by drying, in such a manner as to allow part of the organic substances contained in the sinter material 20 (e.g., the organic protective films 22 and part of the organic solvent 21) to remain. Herewith, a state as depicted in FIG. 3B is obtained, where the semiconductor chip 30 is temporarily bonded (temporarily fixed) to the first main surface 11 of the conductive plate 10 via the sinter material 20 containing the organic substances.

In the definitive bonding step (FIGS. 1C and 2D) following the above-described temporary bonding step, the sinter material 20 undergone heating and pressurizing according to the first condition in the temporary bonding step is subjected to higher heating temperature and pressure according to the second condition. As a result, the organic solvent 21 and the organic protective films 22 contained in the sinter material 20 are volatilized or decomposed to be thus removed, and the metal particles 23 are then sintered together. Herewith, a state as depicted in FIG. 3C is obtained, where the semiconductor chip 30 is bonded (definitively bonded), via the sinter material 20 thus sintered, to the first main surface 11 of the conductive plate 10.

By the above-described definitive bonding step, the conductive plate 10 and the semiconductor chip 30 are mechanically and electrically connected to each other via the sintered sinter material 20.

Note that FIGS. 1A to 1C and FIGS. 2A to 2D illustrate examples where the single semiconductor chip 30 is mounted on the first main surface 11 of the conductive plate 10 via the sinter material 20; however, on the first main surface 11 of the conductive plate 10, multiple semiconductor chips 30 may be mounted individually via the sinter material 20.

Next described is a preparatory step for definitive bonding, which is conducted between the temporary bonding step (first bonding step) and the definitive bonding step (second bonding step).

Figure 4:
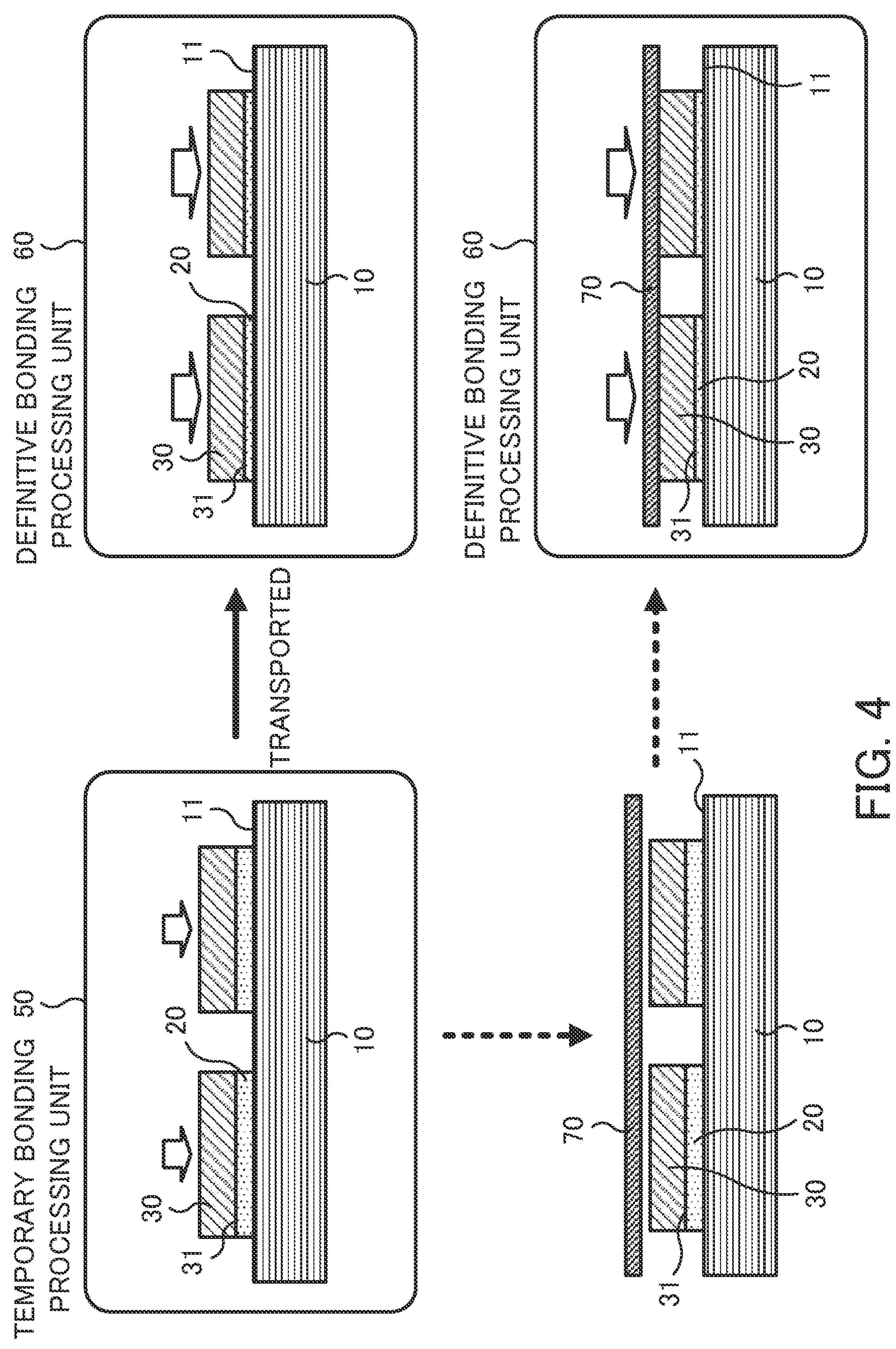
FIG. 4 illustrates a preparatory step for definitive bonding of the conductive plate and the semiconductor chip using the sinter material.

FIG. 4 illustrates a preparatory step for definitive bonding of the conductive plate and the semiconductor chip using the sinter material.

Here, a configuration using the sheet-like sinter material 20 illustrated in FIGS. 2A to 2D above is taken as an example for the sake of convenience. FIG. 4 illustrates, as an example, a configuration where multiple semiconductor chips 30 (two in this case) are mounted, individually via the sinter material 20, on the first main surface 11 of the conductive plate 10.

As for a structure in which the semiconductor chips 30 are individually disposed on the first main surface 11 of the conductive plate 10 via the sinter materials 20 (the sheet-like sinter materials 20), whose organic solvent 21 has been partially volatilized by drying (FIG. 2C), temporary bonding takes place in a temporary bonding processing unit 50, as illustrated in FIG. 4 (top left diagram). The temporary bonding of the structure is achieved in the temporary bonding processing unit 50 by applying heat and pressure according to the first condition that allows the organic substances contained in the sinter materials 20 to partially remain. Note that the temporary bonding processing unit 50 is a processing unit or area for conducting the temporary bonding step in the production line of the semiconductor device 1. The temporary bonding processing unit 50 includes a mechanism for transporting the conductive plate 10 (specifically, an insulated circuit board or lead frame including the conductive plate 10); a mechanism for transporting the semiconductor chips 30 (in this example, the semiconductor chips 30 and the sheet-like sinter materials 20 each transferred and adhering to the individual semiconductor chips 30); a mechanism for heating the structure in which the conductive plate 10 and the semiconductor chips 30 are disposed via the sinter materials 20 therebetween; and a mechanism for pressurizing the structure.

The structure where the semiconductor chips 30 are temporarily bonded to the conductive plate 10 via the sinter materials 20 in the temporary bonding processing unit 50 is then transported, for example, from the temporary bonding processing unit 50 to a definitive bonding processing unit 60 (solid arrow in FIG. 4), as illustrated in FIG. 4 (upper section). For example, the structure is transported from the temporary bonding processing unit 50 to the definitive bonding processing unit 60 by a transport mechanism, such as a conveyor or a robot arm. The structure transported to the definitive bonding processing unit 60 undergoes therein heat and pressure treatment according to the second condition that removes the organic substances contained in the sinter materials 20 and sinters the metal particles together. As a result, the semiconductor chips 30 are definitively bonded to the conductive plate 10 via the sinter materials 20. Note that the definitive bonding processing unit 60 is a processing unit or area for conducting the definitive bonding step in the production line of the semiconductor device 1. The definitive bonding processing unit 60 includes a mechanism for transporting the structure in which the semiconductor chips 30 are temporarily bonded to the conductive plate 10 via the sinter materials 20; a mechanism for heating the structure; and a mechanism for pressurizing the structure.

The structure where the semiconductor chips 30 are temporarily bonded to the conductive plate 10 via the sinter materials 20 in the temporary bonding processing unit 50 may be covered with a protective sheet 70, and then undergo, in the definitive bonding processing unit 60, the heat and pressure treatment according to the second condition for definitive bonding (dotted arrow in FIG. 4), as illustrated in FIG. 4 (lower section).

As for the protective sheet 70, in the case where multiple semiconductor chips 30 are mounted on the first main surface 11 of the conductive plate 10, a single protective sheet 70 may be disposed in such a manner as to cover the multiple semiconductor chips 30, as illustrated in FIG. 4. Alternatively, although not illustrated here, multiple protective sheets 70 may be disposed in such a manner as to individually cover each of the semiconductor chips 30.

As the protective sheet 70, a flexible sheet is used. The protective sheet 70 is made of, for example, a silicone resin, a polyimide resin, graphite, or the like. The protective sheet 70 covers the structure temporarily bonded in the temporary bonding processing unit 50. This prevents, during the subsequent definitive bonding in the definitive bonding processing unit 60, a jig used to pressurize the semiconductor chips 30 from directly colliding with and thus damaging the semiconductor chips 30.

The placement of the protective sheet 70 on the structure temporarily bonded in the temporarily bonding processing unit 50 may take place in the temporarily bonding processing unit 50. Alternatively, after the structure temporarily bonded in the temporarily bonding processing unit 50 is transported from the temporarily bonding processing unit 50 to the definitive bonding processing unit 60, the protective sheet 70 may be disposed inside the definitive bonding processing unit 60. Yet alternatively, the placement of the protective sheet 70 on the structure temporarily bonded in the temporarily bonding processing unit 50 may take place outside the temporary bonding processing unit 50 and the definitive bonding processing unit 60 after the structure is brought out of the temporary bonding processing unit 50 and before it is brought into the definitive bonding processing unit 60. The structure temporarily bonded in the temporarily bonding processing unit 50 may be conveyed to the definitive bonding processing unit 60, with the protective sheet 70 disposed thereon.

The preparatory step for definitive bonding, which is carried out between the temporary bonding step and the definitive bonding step, includes transportation from the temporary bonding processing unit 50 to the definitive bonding processing unit 60, and disposition of the protective sheet 70, which takes place in either one of the temporary bonding processing unit 50 and the definitive bonding processing unit 60 or outside these processing units 50 and 60, as illustrated in FIG. 4.

The configuration using the sheet-like sinter material 20 of FIGS. 2A to 2D above is here taken as an example; however, the same goes for a configuration using the paste-like sinter material 20 of FIGS. 1A to 1C above, and such transportation and disposition of the protective sheet 70 are performed between the temporary bonding step and the definitive bonding step as the preparatory step for definitive bonding.

In the preparatory step (such as transportation and disposition of the protective sheet 70) for definitive bonding, taking place between the temporary bonding step and the definitive bonding step, the semiconductor chip 30 temporarily bonded to the first main surface 11 of the conductive plate 10 via the sinter material 20 may be shifted in position if the sinter material 20 exhibits poor adhesion.

That is, in the structure where the semiconductor chip 30 is temporarily bonded to the first main surface 11 of the conductive plate 10 via the sinter material 20 (FIGS. 1B, 2C, 3B, and 4), the sinter material 20 is subjected to drying to partially remove the organic substances (the organic solvent 21) and then heat and pressure treatment according to the first condition that allows the organic substances (the organic solvent 21 and the organic protective films 22) contained in the sinter material 20 to partially remain. For this reason, in this structure where the semiconductor chip 30 is temporarily bonded to the first main surface 11 of the conductive plate 10 via the sinter material 20, the sinter material 20 tends to exhibit lower adhesion than in the initial paste state. Further, oxygen and carbon contained in the environment where the conductive plate 10 is handled may be adsorbed to the first main surface 11 of the conductive plate 10 before the sinter material 20 is attached thereto. A certain amount or more of oxygen and carbon adsorbed to the first main surface 11 of the conductive plate 10 leads to further reduced adhesion of the sinter material 20 to the first main surface 11 at the time of temporary bonding.

When the sinter material 20, whose adhesion has been reduced by drying, heating, and the like, is attached to the first main surface 11 of the conductive plate 10 to which a certain amount or more of oxygen and carbon has been adsorbed to further reduce the adhesion, the sinter material 20 is not able to exhibit adhesion enough to hold the semiconductor chip 30 against the first main surface 11. If the sinter material 20 does not have sufficient adhesion, an external force applied during the preparation for definitive bonding following the temporary bonding, e.g., an external force caused by vibration during transportation or contact with the protective sheet 70 may displace the semiconductor chip 30 with respect to the first main surface 11 of the conductive plate 10. In the case where multiple semiconductor chips 30 are mounted on the first main surface 11 of the conductive plate 10, the degree of displacement may differ among the multiple semiconductor chips 30. Covering the multiple semiconductor chips 30 with a single protective sheet 70 or transporting the multiple semiconductor chips 30 covered with the single protective sheet 70 may be likely to cause displacement of a greater number of the semiconductor chips 30 or to result in the degree of displacement differing among the multiple semiconductor chips 30.

The displaced semiconductor chip 30 being bonded to the first main surface 11 of the conductive plate 10 may create problems, for example, in subsequent connections (such as poor connections) between the semiconductor chip 30 and other parts (e.g., conductive wires, clips, blocks, and circuit boards), thus possibly causing a decrease in the yield and quality of the semiconductor device 1.

Note that, in the case of the method using the paste-like sinter material 20 (FIGS. 1A to 1C), it may be considered appropriate to contain, in the organic solvent, ingredients for removing oxygen and the like adsorbed to the first main surface 11 of the conductive plate 10 and remove oxygen and the like from the first main surface 11 with the paste-like sinter material 20 applied to the first main surface 11 (FIG. 1A), to thereby prevent a decrease in the adhesion of the sinter material 20 to some extent. However, the inclusion of such ingredients may lead to a rise in cost or the like. On the other hand, in the case of the method using the sheet-like sinter material 20 (FIGS. 2A to 2D), it is difficult to increase the amount of the organic solvent contained in the sinter material 20 because the sheet-like sinter material 20 needs to maintain the sheet shape when transferred to the back surface of the semiconductor chip 30. Therefore, the sheet-like sinter material 20 is not able to sufficiently remove oxygen and the like from the first main surface 11, and thus it is difficult to prevent a decrease in the adhesion of the sinter material 20.

In addition, bringing the heating temperature and pressure for the temporary bonding to relatively high settings (e.g., a heating temperature of 200° C. and a pressure of 5 MPa) may ensure a certain degree of adhesion of the sinter material 20. However, in the following definitive bonding (e.g., a heating temperature ranging from 200° C. and 300° C., inclusive, and a pressure ranging from 10 MPa and 40 MPa, inclusive), sintering of the sinter material 20 does not proceed well, which results in reduced bonding strength of the semiconductor chip 30. This is because, at the time of temporary bonding, volatilization of the above-mentioned organic protective films coating the metal particles promotes alloying of the metal particles to convert them into a porous structure, which no longer leads to sufficient sintering at the subsequent definitive bonding. For this reason, it is desirable to perform temporary bonding at a relatively low heating temperature (e.g., in the range between 100° C. and 180° C., inclusive) and a relatively low pressure (e.g., 5 MPa or lower); however, in this case, the sinter material 20 may fail to provide sufficient adhesion, which may cause displacement of the semiconductor chip 30.

It is also conceivable to omit temporary bonding and achieve definitive bonding by sintering the sinter material 20 at the same time as the placement of the semiconductor chip 30 on the first main surface 11 of the conductive plate 10 via the sinter material 20. However, this method needs ample time for sintering (3 minutes or more and 5 minutes or less), which in turn prolongs the time needed for bonding the semiconductor chip 30 and manufacturing the semiconductor device 1.

Therefore, a desired method is capable of achieving sufficient adhesion of the sinter material 20; performing temporary bonding at a relatively low heating temperature (e.g., in the range between 100° C. and 180° C., inclusive) and a relatively low pressure (e.g., 5 MPa or lower) in a relatively short time (e.g., 10 seconds or less); preventing, by the temporary bonding, displacement of the semiconductor chip 30 in the preparatory step performed between the temporary bonding and the definitive bonding; and providing sufficient sintering and bonding strength in the definitive bonding following the temporary bonding.

In view of these points, the following method is adopted as an example to prevent a decrease in the adhesion of the sinter material 20 and the resulting displacement of the semiconductor chip 30.

Figure 5:
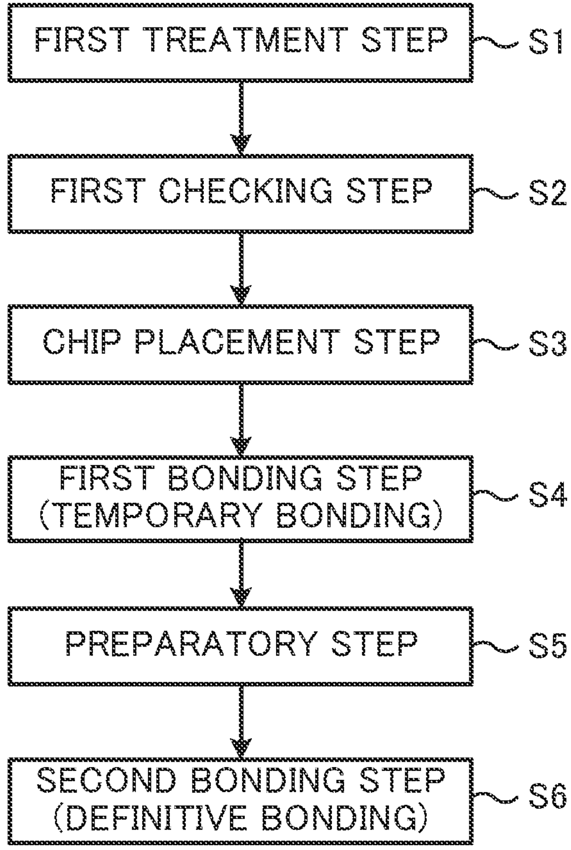
FIG. 5 illustrates an example of the semiconductor device manufacturing method.
Figure 6A:
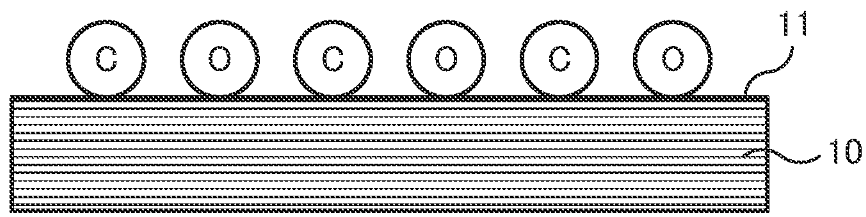
FIGS. 6A to 6C illustrate a first treatment step and a first checking step for a conductive plate in a semiconductor device manufacturing method according to a first embodiment.
Figure 6B:
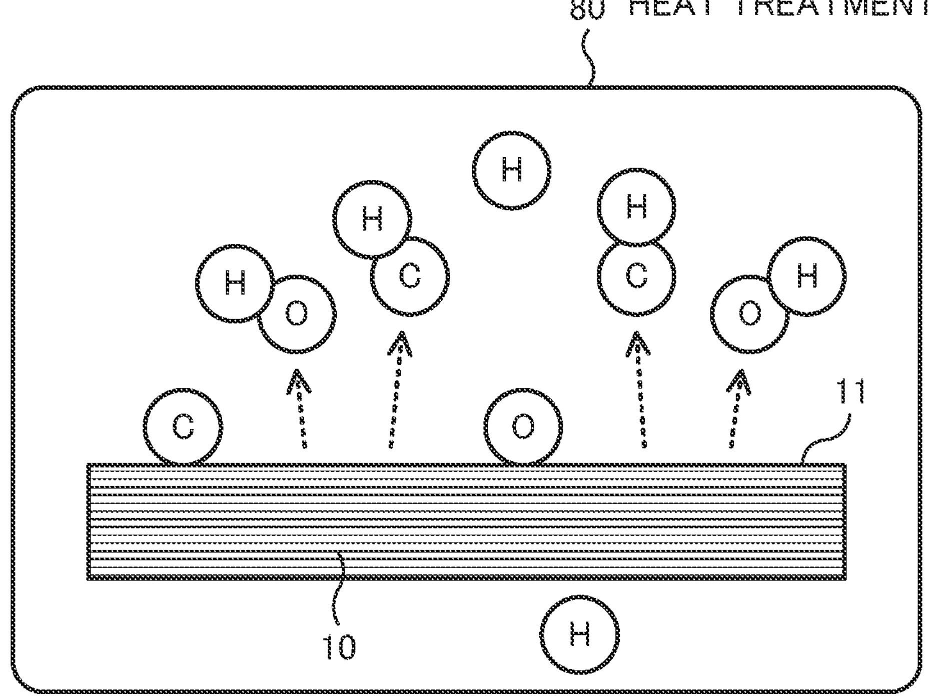
Figure 6C:
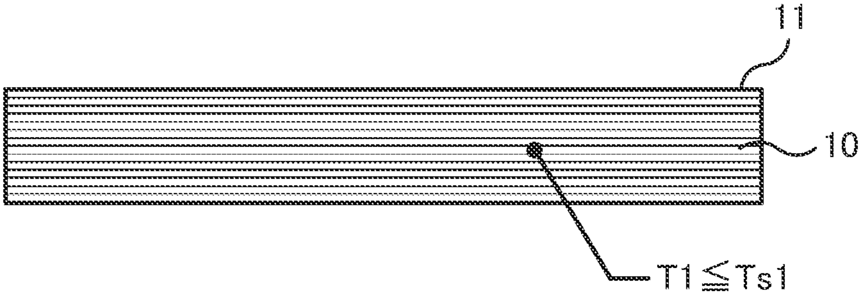

FIG. 5 illustrates an example of the semiconductor device manufacturing method. FIGS. 6A to 6C illustrate a first treatment step and a first checking step for a conductive plate in a semiconductor device manufacturing method according to the first embodiment. FIG. 6A is a schematic cross-sectional view with relevant parts of an example of the conductive plate prior to a heat treatment step. FIG. 6B is a schematic cross-sectional view with relevant parts of an example of the heat treatment step for the conductive plate. FIG. 6C is a schematic cross-sectional view with relevant parts of an example of the conductive plate after the heat treatment step.

In the manufacturing method of the semiconductor device 1 according to the first embodiment, the first treatment step (step S1) and the first checking step (step S2) are conducted on the conductive plate 10 prior to a chip placement step (step S3) in which the semiconductor chip 30 together with the sinter material 20 is placed on the conductive plate 10, as illustrated in FIG. 5.

In the first treatment step (step S1), the conductive plate 10 depicted in FIG. 6A is prepared. To the first main surface 11 of the conductive plate 10, oxygen O and carbon C contained in the environment where the conductive plate 10 is handled are adsorbed, as illustrated in FIG. 6A.

The prepared conductive plate 10 is transported to a heat treatment unit 80, for example, a reflow furnace, and is heat-treated under a reducing gas atmosphere in the heat treatment unit 80, as illustrated in FIG. 6B. For example, in the heat treatment unit 80, the conductive plate 10 is heat-treated at 300° C. for 15 minutes under a hydrogen gas atmosphere. By the heat treatment in the heat treatment unit 80 under the predetermined condition, oxygen O and carbon C adsorbed to the first main surface 11 of the conductive plate 10 combine with hydrogen H and are desorbed from the first main surface 11. As a result, the amount of oxygen O and carbon C adsorbed to the first main surface 11 of the conductive plate 10 is reduced to thereby make the first main surface 11 clean. For example, the conductive plate 10 is subjected to heat treatment under a reducing gas atmosphere in the heat treatment unit 80 so that the total amount of oxygen O and carbon C adsorbed to the first main surface 11 is reduced to 20 atomic % or less based on findings depicted in FIG. 7 below.

The conductive plate 10 after the heat treatment is cooled naturally or forcibly in the heat treatment unit 80. At that time, it is checked whether a first temperature T1 of the conductive plate 10 has reached or fallen below a first reference temperature Ts1. This is the first checking step (step S2). The first reference temperature Ts1, which is the reference for checking the first temperature T1 of the conductive plate 10, is set to such a temperature as to prevent oxygen O and carbon C in the environment, where the conductive plate 10 is handled, from being re-adsorbed to the first main surface 11 of the conductive plate 10 out of the heat treatment unit 80 and then causing oxidation and carbonization. The first reference temperature Ts1 is set, for example, to 80° C.

After the heat treatment, the conductive plate 10 having reached the first temperature T1, which is equal to or lower than the first reference temperature Ts1, is carried out of the heat treatment unit 80, as illustrated in FIG. 6C. In the conductive plate 10 being carried out, re-adsorption of oxygen O and carbon C to the first main surface 11 and the resultant oxidation and carbonization do not take place because the first temperature T1 has reached or fallen below the first reference temperature Ts1.

The conductive plate 10 having a temperature equal to or lower than the first reference temperature Ts1, carried out of the heat treatment unit 80 after being subjected to the heat treatment under a reducing gas atmosphere, i.e., the conductive plate 10 having undergone the first treatment step (step S1) and the first checking step (step S2) depicted in FIG. 5, is used in the subsequent chip placement step (step S3), first bonding step (step S4), preparatory step (step S5), and second bonding step (step S6) depicted in FIG. 5.

As an example, in the chip placement step (step S3), the paste-like sinter material 20 is applied to the first main surface 11 of the conductive plate 10 having undergone the first treatment step (step S1) and the first checking step (step S2) and the semiconductor chip 30 is then placed on the sinter material 20, as illustrated in FIGS. 1A and 1B above. In the first bonding step (step S4), heat and pressure are applied according to the first condition, as illustrated in FIG. 1B above, to allow the organic protective films coating the metal particles and part of the organic solvent of the sinter material 20 to remain, and the semiconductor chip 30 is temporarily bonded (or temporarily fixed) to the first main surface 11 of the conductive plate 10 via the sinter material 20 with part of the organic substances remaining therein. In the subsequent preparation step (step S5), predetermined preparations for definitive bonding, such as transportation and disposition of the protective sheet 70, are performed according to the example of FIG. 4. Then, in the second bonding step (step S6), heat and pressure are applied according to the second condition, as illustrated in FIG. 1C and the like above, to remove the organic substances and sinter the metal particles together, and the semiconductor chip 30 is bonded (or definitively bonded) to the first main surface 11 of the conductive plate 10 via the sinter material 20 thus sintered. In this manner, the semiconductor device 1 is produced.

As another example, in the chip placement step (step S3), the semiconductor chip 30 with the sheet-like sinter material 20 transferred and adhering thereto, which is prepared in the steps depicted in FIGS. 2A and 2B above, is placed on the first main surface 11 of the conductive plate 10 having undergone the first treatment step (step S1) and the first checking step (step S2), as illustrated in FIG. 2C and the like above. In the first bonding step (step S4), heat and pressure are applied according to the first condition, as illustrated in FIG. 2C and the like above, to allow the organic protective films coating the metal particles and part of the organic solvent of the sinter material 20 to remain, and the semiconductor chip 30 is temporarily bonded (or temporarily fixed) to the first main surface 11 of the conductive plate 10 via the sinter material 20 with part of the organic substances remaining therein. In the subsequent preparation step (step S5), predetermined preparations for definitive bonding, such as transportation and disposition of the protective sheet 70, are performed according to the example of FIG. 4. Then, in the second bonding step (step S6), heat and pressure are applied according to the second condition, as illustrated in FIG. 2D and the like above, to remove the organic substances and sinter the metal particles together, and the semiconductor chip 30 is bonded (or definitively bonded) to the first main surface 11 of the conductive plate 10 via the sinter material 20 thus sintered. In this manner, the semiconductor device 1 is produced.

In the manufacturing method for the semiconductor device 1 that employs the first treatment step and the first checking step according to the first embodiment, the amount of oxygen and carbon adsorbed to the first main surface 11 of the conductive plate 10 is controlled to be a certain amount or less, for example, 20 atomic % or less by heat treatment under a reducing gas atmosphere. This prevents a decrease in the adhesion of the sinter material 20 to the first main surface 11 of the conductive plate 10 in temporarily bonding the semiconductor chip 30 to the first main surface 11. Herewith, it is possible to minimize displacement of the semiconductor chip 30 during the preparatory step, including transportation, disposition of the protective sheet 70 and the like, performed between the temporary bonding and the definitive bonding.

In addition, in the manufacturing method for the semiconductor device 1 that employs the first treatment step and the first checking step according to the first embodiment, the sinter material 20 after temporary bonding offers sufficient adhesion to the first main surface 11 of the conductive plate 10. The temporary bonding is performed according to the above-described first condition that specifies a relatively low heating temperature (e.g., in the range between 100° C. and 180° C., inclusive), a relatively low pressure (e.g., 5 MPa or lower) in a relatively short time (e.g., 10 seconds or less). Then, definitive bonding executed following the temporary bonding under such a condition is able to achieve sufficient sintering and bonding strength.

Figure 7:
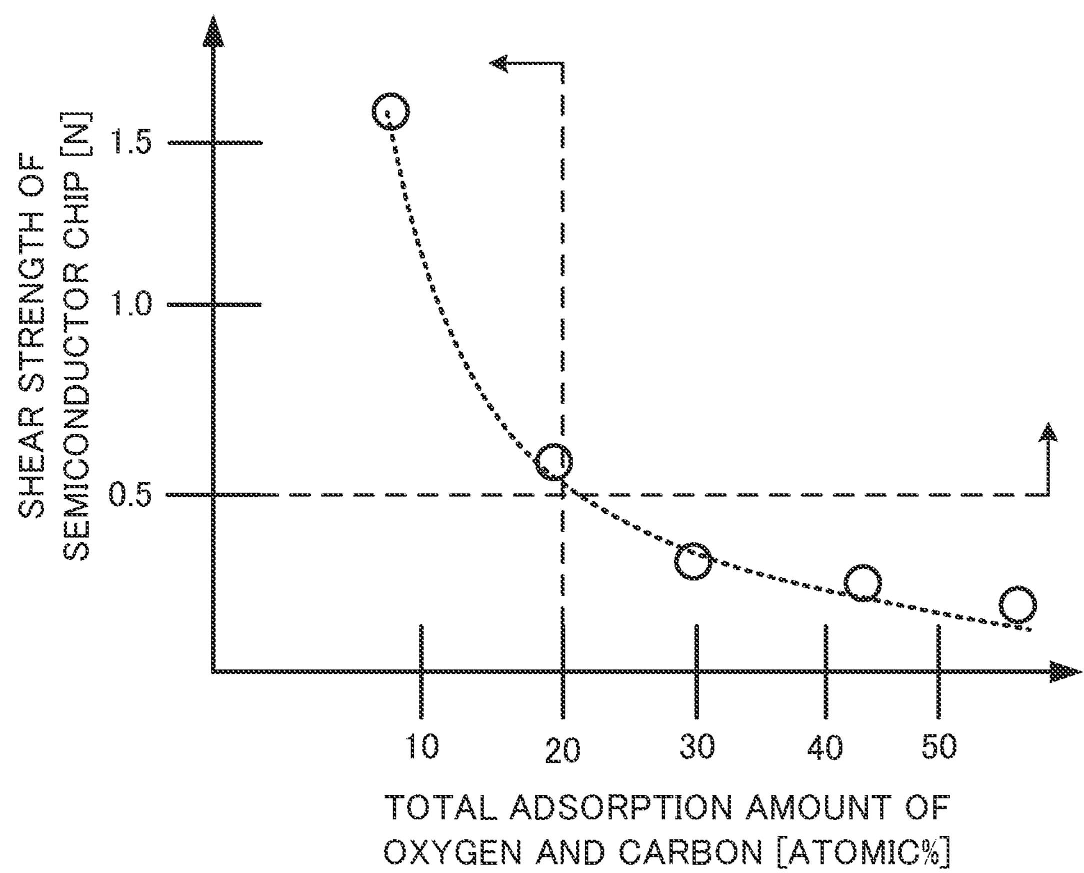
FIG. 7 illustrates an example of a relationship between the amount of oxygen and carbon adsorbed to the conductive plate and shear strength of the semiconductor chip.

FIG. 7 illustrates an example of a relationship between the amount of oxygen and carbon adsorbed to the conductive plate and shear strength of the semiconductor chip.

In FIG. 7, the horizontal axis represents the total adsorption amount [atomic %] of oxygen and carbon on the first main surface 11 of the conductive plate 10 before the sinter material 20 is attached thereto while the vertical axis represents the shear strength [N] of the semiconductor chip 30 temporarily bonded to the first main surface 11 of the conductive plate 10 via the sinter material 20. The total adsorption amount of oxygen and carbon on the first main surface 11 of the conductive plate 10 is measured by Electron Spectroscopy for Chemical Analysis (ESCA).

A trend seen from FIG. 7 is that, as the amount of oxygen and carbon adsorbed to the first main surface 11 of the conductive plate 10 before the sinter material 20 is attached thereto decreases, the shear strength of the semiconductor chip 30 temporarily bonded to the first main surface 11 via the sinter material 20 increases. For example, when the sinter material 20 is attached to the first main surface 11 of the conductive plate 10 with such adhesion that the shear strength of the semiconductor chip 30 is 0.5 N or more, it is possible to sufficiently minimize displacement of the semiconductor chip 30 during the preparatory step, including transportation, disposition of the protective sheet 70 and the like, performed between the temporary bonding and the definitive bonding. In order to obtain such a share strength of the semiconductor chip 30, it is preferable to keep the total adsorption amount of oxygen and carbon on the first main surface 11 of the conductive plate 10 before the sinter material 20 is attached thereto at 20 atomic % or below.

Based on the findings of FIG. 7, the first treatment step where the above-described heat treatment in a reducing gas atmosphere takes place and the subsequent first checking step are performed such that the total amount of oxygen and carbon adsorbed to the first main surface 11 of the conductive plate 10 is reduced to 20 atomic % or below.

The manufacturing method for the semiconductor device 1, employing the first treatment step and the first checking step according to the first embodiment, effectively minimizes displacement of the semiconductor chip 30 caused by decreased adhesion of the sinter material 20. This prevents problems, for example, in connections (such as poor connections) between the semiconductor chip 30 after being bonded to the conductive plate 10 and other parts (e.g., conductive wires, clips, blocks, and circuit boards), which enables high-quality semiconductor device 1 with good yield.

(b) Second Embodiment

The first embodiment above provides a case where heat treatment under a reducing gas atmosphere is carried out as the first treatment step to reduce the amount of oxygen and carbon adsorbed to the first main surface 11 of the conductive plate 10; however, the method for reducing the amount of oxygen and carbon adsorbed to the first main surface 11 is not limited to this. A second embodiment is described next, taking an example of adopting another method for reducing the amount of oxygen and carbon adsorbed to the first main surface 11 of the conductive plate 10.

Figure 8A:
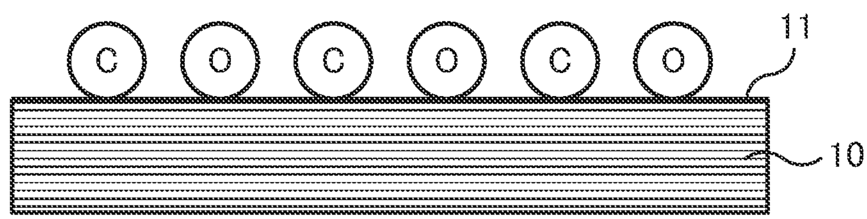
FIGS. 8A to 8C illustrate a first treatment step and a first checking step for a conductive plate according to a second embodiment.
Figure 8B:
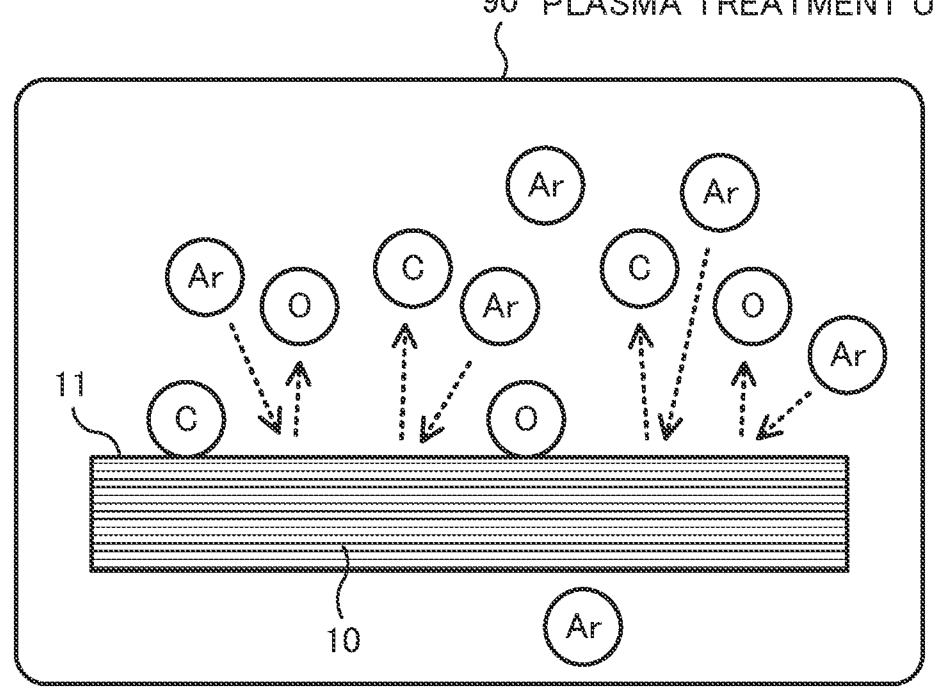
Figure 8C:
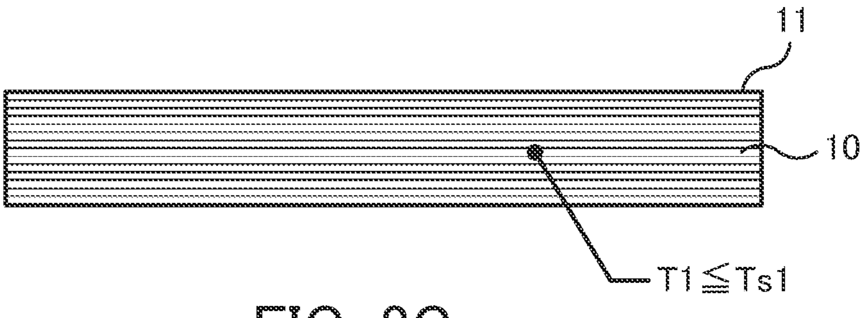

FIGS. 8A to 8C illustrate a first treatment step and a first checking step for a conductive plate according to a second embodiment. FIG. 8A is a schematic cross-sectional view with relevant parts of an example of the conductive plate before a plasma treatment step. FIG. 8B is a schematic cross-sectional view with relevant parts of an example of the plasma treatment step for the conductive plate. FIG. 8C is a schematic cross-sectional view with relevant parts of an example of the conductive plate after the plasma treatment step.

The manufacturing method for the semiconductor device 1 according to the second embodiment includes the individual steps depicted in FIG. 5 above, that is, the first treatment step (step S1); the first checking step (step S2); the chip placement step (step S3); the first bonding step (step S4); the preparatory step (step S5); and the second bonding step (step S6).

In the manufacturing method for the semiconductor device 1 according to the second embodiment, the conductive plate 10 with the first main surface 11 to which oxygen O and carbon C are adsorbed, as illustrated in FIG. 8A, is transported into a plasma treatment unit 90, which is, for example, a treatment chamber, as illustrated in FIG. 8B, in the first treatment step (step S1) of FIG. 5. In the plasma treatment unit 90, the conductive plate 10 is plasma-treated under an inert gas atmosphere. For example, the conductive plate 10 is plasma-treated, within the plasma treatment unit 90, in an argon gas atmosphere or a nitrogen gas atmosphere under room or elevated temperature conditions. Note that FIG. 8B depicts an example of using argon Ar.

By the plasma treatment under predetermined conditions in the plasma treatment unit 90, oxygen O and carbon C adsorbed to the first main surface 11 of the conductive plate 10 are repelled by collision with argon Ar and thus desorbed from the first main surface 11. As a result, the amount of oxygen O and carbon C adsorbed to the first main surface 11 of the conductive plate 10 is reduced to thereby make the first main surface 11 clean. For example, the conductive plate 10 is subjected to plasma treatment under an inert gas atmosphere in the plasma treatment unit 90 so that the total amount of oxygen O and carbon C adsorbed to the first main surface 11 is reduced to 20 atomic % or less based on the findings depicted in FIG. 7 above.

The conductive plate 10 after the plasma treatment is cooled naturally or forcibly in the plasma treatment unit 90. At that time, it is checked whether the first temperature T1 of the conductive plate 10 has reached or fallen below the first reference temperature Ts1, e.g., 80° C., at which re-adsorption of oxygen O and carbon C to the first main surface 11 is prevented. This is the first checking step (step S2). After the plasma treatment, the conductive plate 10 having reached the first temperature T1, which is equal to or lower than the first reference temperature Ts1, is taken out of the plasma treatment unit 90, as illustrated in FIG. 8C.

The conductive plate 10 having a temperature equal to or lower than the first reference temperature Ts1, carried out of the plasma treatment unit 90 after being subjected to the plasma treatment under an inert gas atmosphere, i.e., the conductive plate 10 having undergone the first treatment step (step S1) and the first checking step (step S2) depicted in FIG. 5, is used in the subsequent chip placement step (step S3), first bonding step (step S4), preparatory step (step S5), and second bonding step (step S6) depicted in FIG. 5.

As an example, in the chip placement step (step S3), the paste-like sinter material 20 is applied to the first main surface 11 of the conductive plate 10 having undergone the first treatment step (step S1) and the first checking step (step S2) and the semiconductor chip 30 is then placed on the sinter material 20, as illustrated in FIGS. 1A and 1B above. In the first bonding step (step S4), heat and pressure are applied according to the first condition, as illustrated in FIG. 1B above, to allow the organic protective films coating the metal particles and part of the organic solvent of the sinter material 20 to remain, and the semiconductor chip 30 is temporarily bonded (or temporarily fixed) to the first main surface 11 of the conductive plate 10 via the sinter material 20 with part of the organic substances remaining therein. In the subsequent preparation step (step S5), predetermined preparations for definitive bonding, such as transportation and disposition of the protective sheet 70, are performed according to the example of FIG. 4. Then, in the second bonding step (step S6), heat and pressure are applied according to the second condition, as illustrated in FIG. 1C and the like above, to remove the organic substances and sinter the metal particles together, and the semiconductor chip 30 is bonded (or definitively bonded) to the first main surface 11 of the conductive plate 10 via the sinter material 20 thus sintered. In this manner, the semiconductor device 1 is produced.

As another example, in the chip placement step (step S3), the semiconductor chip 30 with the sheet-like sinter material 20 transferred and adhering thereto, which is prepared in the steps depicted in FIGS. 2A and 2B above, is placed on the first main surface 11 of the conductive plate 10 having undergone the first treatment step (step S1) and the first checking step (step S2), as illustrated in FIG. 2C and the like above. In the first bonding step (step S4), heat and pressure are applied according to the first condition, as illustrated in FIG. 2C and the like above, to allow the organic protective films coating the metal particles and part of the organic solvent of the sinter material 20 to remain, and the semiconductor chip 30 is temporarily bonded (or temporarily fixed) to the first main surface 11 of the conductive plate 10 via the sinter material 20 with part of the organic substances remaining therein. In the subsequent preparation step (step S5), predetermined preparations for definitive bonding, such as transportation and disposition of the protective sheet 70, are performed according to the example of FIG. 4. Then, in the second bonding step (step S6), heat and pressure are applied according to the second condition, as illustrated in FIG. 2D and the like above, to remove the organic substances and sinter the metal particles together, and the semiconductor chip 30 is bonded (or definitively bonded) to the first main surface 11 of the conductive plate 10 via the sinter material 20 thus sintered. In this manner, the semiconductor device 1 is produced.

In the manufacturing method for the semiconductor device 1 that employs the first treatment step and the first checking step according to the second embodiment, the amount of oxygen and carbon adsorbed to the first main surface 11 of the conductive plate 10 is controlled to be a certain amount or less, for example, 20 atomic % or less by plasma treatment under an inert gas atmosphere. This prevents a decrease in the adhesion of the sinter material 20 to the first main surface 11 of the conductive plate 10 in temporarily bonding the semiconductor chip 30 to the first main surface 11. Herewith, it is possible to minimize displacement of the semiconductor chip 30 during the preparatory step, including transportation, disposition of the protective sheet 70 and the like, performed between the temporary bonding and the definitive bonding.

In addition, in the manufacturing method for the semiconductor device 1 that employs the first treatment step and the first checking step according to the second embodiment, the sinter material 20 after temporary bonding offers sufficient adhesion to the first main surface 11 of the conductive plate 10. The temporary bonding is performed according to the above-described first condition that specifies a relatively low heating temperature (e.g., in the range between 100° C. and 180° C., inclusive), a relatively low pressure (e.g., 5 MPa or lower) in a relatively short time (e.g., 10 seconds or less). Then, definitive bonding executed following the temporary bonding under such a condition is able to achieve sufficient sintering and bonding strength.

The manufacturing method for the semiconductor device 1, employing the first treatment step and the first checking step according to the second embodiment, effectively minimizes displacement of the semiconductor chip 30 caused by decreased adhesion of the sinter material 20. This prevents problems, for example, in connections (such as poor connections) between the semiconductor chip 30 after being bonded to the conductive plate 10 and other parts (e.g., conductive wires, clips, blocks, and circuit boards), which enables high-quality semiconductor device 1 with good yield.

(c) Third Embodiment

The first embodiment above describes a case of performing the first treatment step, in which heat treatment is conducted under a reducing gas atmosphere, and the subsequent first checking step on the conductive plate 10; however, not only the conductive plate 10 but also the semiconductor chip 30 may be subjected to the heat treatment under a reducing gas atmosphere. A case of performing heat treatment on both the conductive plate 10 and the semiconductor chip 30 under a reducing gas atmosphere is described next as a third embodiment.

Figure 9:
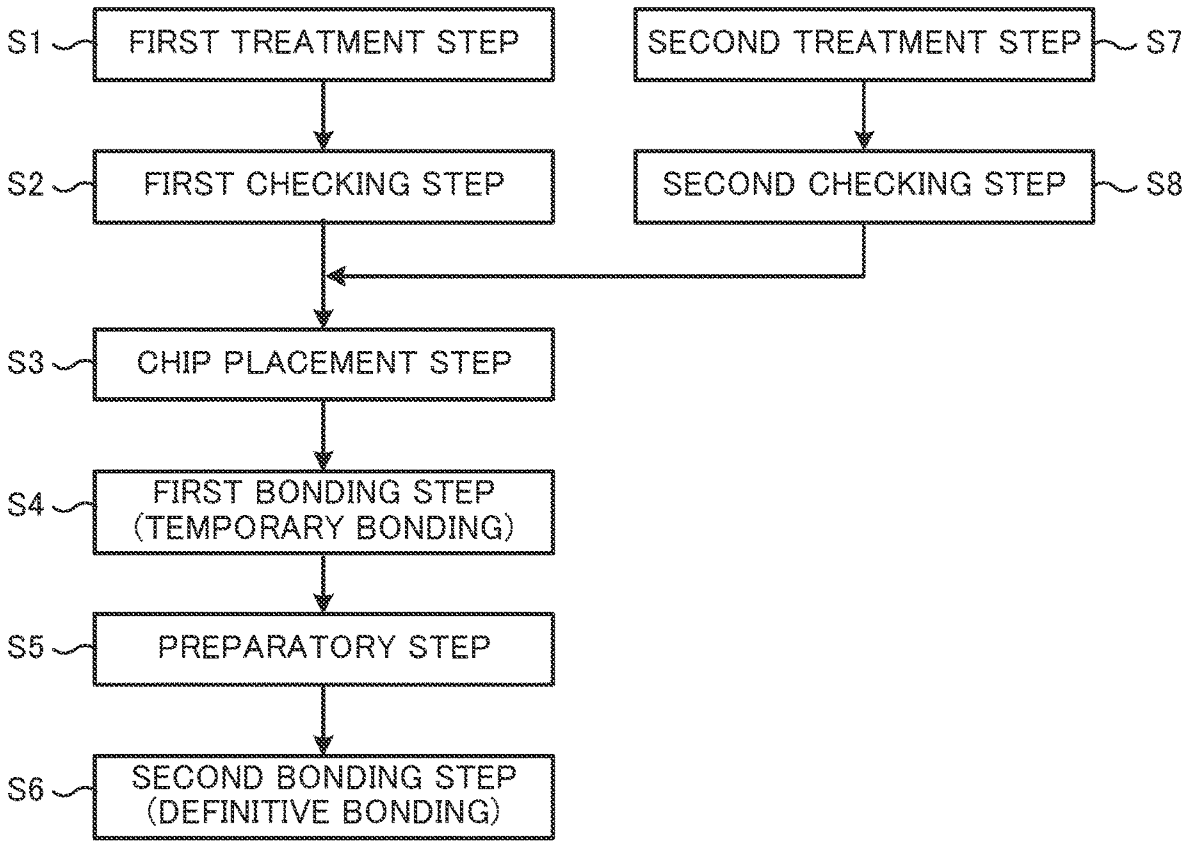
FIG. 9 illustrates another example of the semiconductor device manufacturing method.
Figure 10A:
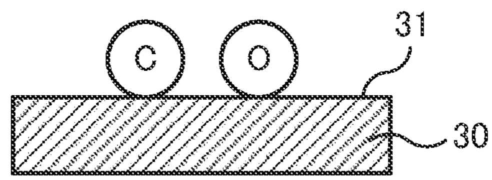
FIGS. 10A to 10C illustrate a second treatment step and a second checking step for a semiconductor chip in a semiconductor device manufacturing method according to a third embodiment.
Figure 10B:
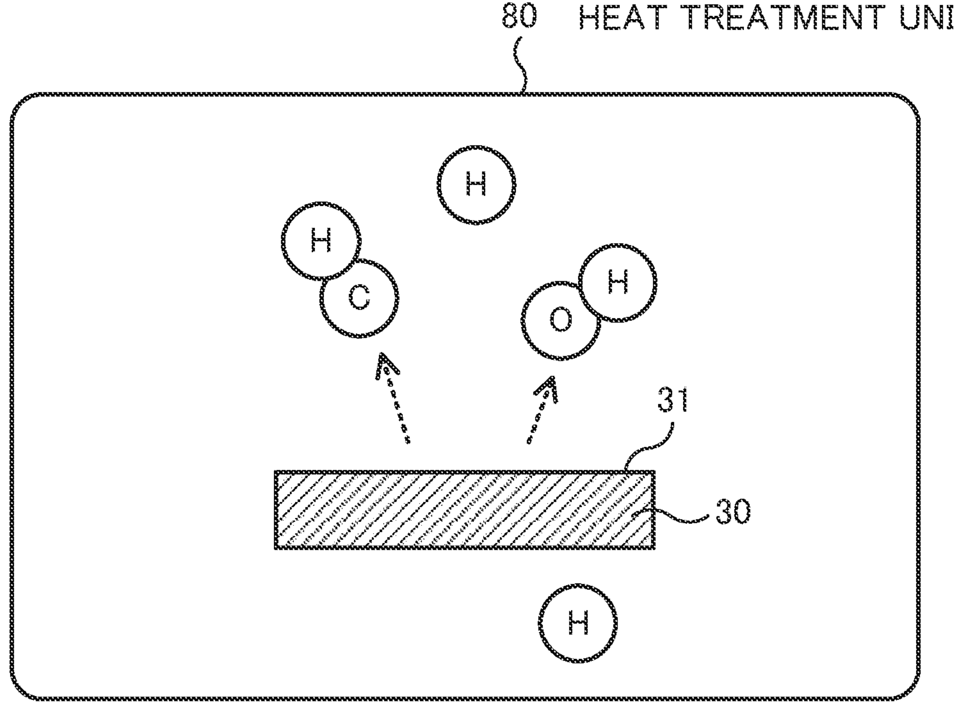
Figure 10C:
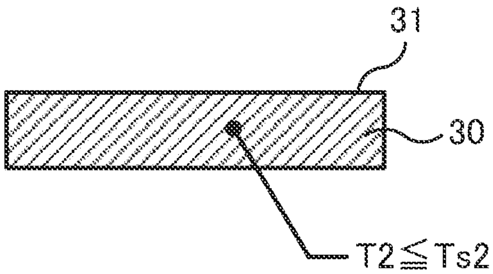

FIG. 9 illustrates another example of the semiconductor device manufacturing method. FIGS. 10A to 10C illustrate a second treatment step and a second checking step for a semiconductor chip in a semiconductor device manufacturing method according to the third embodiment. FIG. 10A is a schematic cross-sectional view with relevant parts of an example of the semiconductor chip prior to a heat treatment step. FIG. 10B is a schematic cross-sectional view with relevant parts of an example of the heat treatment step for the semiconductor chip. FIG. 10C is a schematic cross-sectional view with relevant parts of an example of the semiconductor chip after the heat treatment step.

In the manufacturing method for the semiconductor device 1 according to the third embodiment, the first treatment step (step S1) and the first checking step (step S2) are conducted on the conductive plate 10 prior to the chip placement step (step S3) in which the semiconductor chip 30 together with the sinter material 20 is placed on the conductive plate 10, as illustrated in FIG. 9. Further, in the manufacturing method for the semiconductor device 1 according to the third embodiment, a second treatment step (step S7) and a second checking step (step S8) are conducted on the semiconductor chip 30 prior to the chip placement step (step S3), as represented in FIG. 9. Then, after the first treatment step (step S1) and the first checking step (step S2) for the conductive plate 10 and the second treatment step (step S7) and the second checking step (step S8) for the semiconductor chip 30, the chip placement step (step S3), the first bonding step (step S4), the preparatory step (step S5), and the second bonding step (step S6) are performed.

In the manufacturing method for the semiconductor device 1 according to the third embodiment, the first treatment step and the first checking step for the conductive plate 10 are conducted in the same manner as described in FIGS. 6A to 6C according to the first embodiment. In the manufacturing method for the semiconductor device 1 according to the third embodiment, the second treatment step and the second checking step for the semiconductor chip 30 are conducted according to the example of the first treatment step and the first checking step for the conductive plate 10.

That is, in the manufacturing method for the semiconductor device 1 according to the third embodiment, the semiconductor chip 30 with the second main surface 31 to which oxygen O and carbon C are adsorbed, as illustrated in FIG. 10A, is transported into the heat treatment unit 80, which is, e.g., a reflow furnace, as illustrated in FIG. 10B, in the second treatment step (step S7). The semiconductor chip 30 is heat-treated under a reducing gas atmosphere in the heat treatment unit 80. For example, in the heat treatment unit 80, the semiconductor chip 30 is heat-treated at 300° C. for 15 minutes under a hydrogen gas atmosphere. As a result, the amount of oxygen O and carbon C adsorbed to the second main surface 31 of the semiconductor chip 30 is reduced to thereby make the second main surface 31 clean. For example, the semiconductor chip 30 is subjected to heat treatment under a reducing gas atmosphere in the heat treatment unit 80 so that the total amount of oxygen O and carbon C adsorbed to the second main surface 31 is reduced to 20 atomic % or less based on the findings depicted in FIG. 7 above.

The semiconductor chip 30 after the heat treatment is cooled in the heat treatment unit 80. At that time, it is checked whether a second temperature T2 of the semiconductor chip 30 has reached or fallen below a second reference temperature Ts2, e.g., 80° C., at which re-adsorption of oxygen O and carbon C to the second main surface 31 is prevented. This is the second checking step (step S8). After the heat treatment, the semiconductor chip 30 having reached the second temperature T2, which is equal to or lower than the second reference temperature Ts2, is taken out of the heat treatment unit 80, as illustrated in FIG. 10C.

The semiconductor chip 30 having a temperature equal to or lower than the second reference temperature Ts2 after being subjected to the heat treatment under a reducing gas atmosphere, i.e., the semiconductor chip 30 having undergone the second treatment step (step S7) and the second checking step (step S8) depicted in FIG. 9, is used in the subsequent chip placement step (step S3), first bonding step (step S4), preparatory step (step S5), and second bonding step (step S6) depicted in FIG. 9. In these chip placement step, first bonding step, preparatory step, and second bonding step, the conductive plate 10 having a temperature equal to or lower than the first reference temperature Ts1 after being similarly subjected to heat treatment under a reducing gas atmosphere, i.e., the conductive plate 10 having undergone the first treatment step (step S1) and the first checking step (step S2) depicted in FIG. 9, is used as the conductive plate 10. The chip placement step, the first bonding step, the preparatory step, and the second bonding step are implemented in the same way as described above in the first embodiment in both cases of using either the paste-like sinter material 20 or sheet-like sinter material 20.

In the manufacturing method for the semiconductor device 1 according to the third embodiment, the adsorption amount of oxygen and carbon is controlled on either of the first main surface 11 of the conductive plate 10 or the second main surface 31 of the semiconductor chip 30 to be a certain amount or less, e.g., 20 atomic % or less, by heat treatment under a reducing gas atmosphere. This prevents a decrease in the adhesion of the sinter material 20 not only to the first main surface 11 of the conductive plate 10, but also to the second main surface 31 of the semiconductor chip 30. Herewith, it is further possible to minimize displacement of the semiconductor chip 30 during the preparatory step, including transportation, disposition of the protective sheet 70 and the like, performed between the temporary bonding and the definitive bonding.

In addition, in the manufacturing method for the semiconductor device 1 according to the third embodiment, the sinter material 20 after temporary bonding offers sufficient adhesion to the first main surface 11 of the conductive plate 10 and the second main surface 31 of the semiconductor chip 30. The temporary bonding is performed according to the above-described condition that specifies a relatively low heating temperature (e.g., in the range between 100° C. and 180° C., inclusive), a relatively low pressure (e.g., 5 MPa or lower) in a relatively short time (e.g., 10 seconds or less). Then, definitive bonding executed following the temporary bonding under such a condition is able to achieve sufficient sintering and bonding strength.

The manufacturing method for the semiconductor device 1 according to the third embodiment further effectively minimizes displacement of the semiconductor chip 30 caused by decreased adhesion of the sinter material 20. This prevents problems, for example, in connections between the semiconductor chip 30 after being bonded to the conductive plate 10 and other parts, which in turn enables high-quality semiconductor device 1 with good yield.

(d) Fourth Embodiment

The second embodiment above describes a case of performing the first treatment step, in which plasma treatment is conducted under an inert gas atmosphere, and the subsequent first checking step on the conductive plate 10; however, not only the conductive plate 10 but also the semiconductor chip 30 may be subjected to the plasma treatment under an inert gas atmosphere. A case of performing plasma treatment on both the conductive plate 10 and the semiconductor chip 30 under an inert gas atmosphere is described next as a fourth embodiment.

Figure 11A:
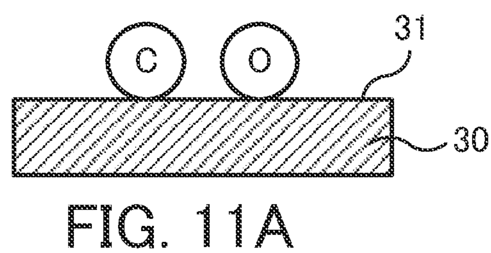
FIGS. 11A to 11C illustrate a second treatment step and a second checking step for a semiconductor chip according to a fourth embodiment.
Figure 11B:
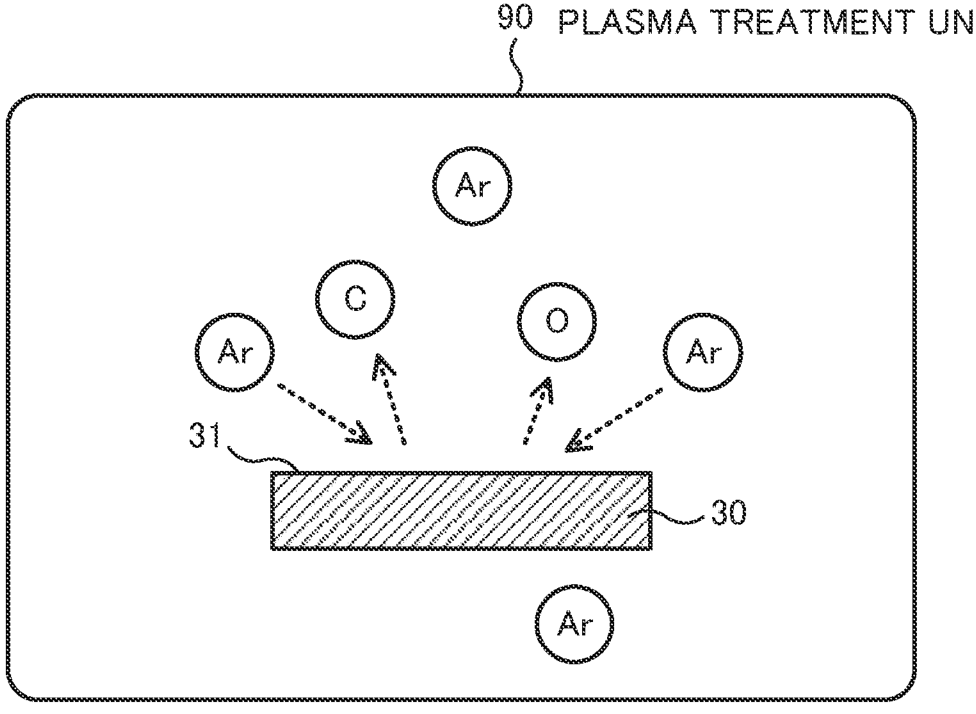
Figure 11C:
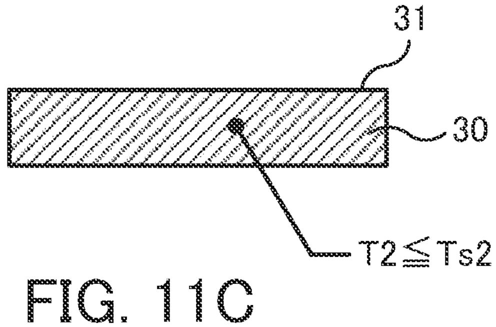

FIGS. 11A to 11C illustrate a second treatment step and a second checking step for a semiconductor chip according to the fourth embodiment. FIG. 11A is a schematic cross-sectional view with relevant parts of an example of the semiconductor chip prior to a plasma treatment step. FIG. 11B is a schematic cross-sectional view with relevant parts of an example of the plasma treatment step for the semiconductor chip. FIG. 11C is a schematic cross-sectional view with relevant parts of an example of the semiconductor chip after the plasma treatment step.

In the manufacturing method for the semiconductor device 1 according to the fourth embodiment, the first treatment step (step S1) and the first checking step (step S2) are conducted on the conductive plate 10 prior to the chip placement step (step S3) in which the semiconductor chip 30 together with the sinter material 20 is placed on the conductive plate 10, as illustrated in FIG. 9. Further, in the manufacturing method for the semiconductor device 1 according to the fourth embodiment, a second treatment step (step S7) and a second checking step (step S8) are conducted on the semiconductor chip 30 prior to the chip placement step (step S3), as represented in FIG. 9. Then, after the first treatment step (step S1) and the first checking step (step S2) for the conductive plate 10 and the second treatment step (step S7) and the second checking step (step S8) for the semiconductor chip 30, the chip placement step (step S3), the first bonding step (step S4), the preparatory step (step S5), and the second bonding step (step S6) are performed.

In the manufacturing method for the semiconductor device 1 according to the fourth embodiment, the first treatment step and the first checking step for the conductive plate 10 are carried out in the same manner as described in FIGS. 8A to 8C according to the second embodiment. In the manufacturing method for the semiconductor device 1 according to the fourth embodiment, the second treatment step and the second checking step for the semiconductor chip 30 are conducted according to the example of the first treatment step and the first checking step for the conductive plate 10.

That is, in the manufacturing method for the semiconductor device 1 according to the fourth embodiment, the semiconductor chip 30 with the second main surface 31 to which oxygen O and carbon C are adsorbed, as illustrated in FIG. 11A, is transported into the plasma treatment unit 90, which is, e.g., a treatment chamber, as illustrated in FIG. 11B, in the second treatment step (step S7) of FIG. 9. The semiconductor chip 30 is plasma-treated under an atmosphere of an inert gas, such as argon or nitrogen, in the plasma treatment unit 90. Note that FIG. 11B depicts an example where argon Ar is used as an inert gas.

By the plasma treatment under predetermined conditions in the plasma treatment unit 90, oxygen O and carbon C adsorbed to the second main surface 31 of the semiconductor chip 30 are repelled by collision with argon Ar and thus desorbed from the second main surface 31. As a result, the amount of oxygen O and carbon C adsorbed to the second main surface 31 of the semiconductor chip 30 is reduced to thereby make the second main surface 31 clean. For example, the semiconductor chip 30 is subjected to plasma treatment under an inert gas atmosphere in the plasma treatment unit 90 so that the total amount of oxygen O and carbon C adsorbed to the second main surface 31 is reduced to 20 atomic % or less based on the findings depicted in FIG. 7 above.

The semiconductor chip 30 after the plasma treatment is cooled in the plasma treatment unit 90. At that time, it is checked whether the second temperature T2 of the semiconductor chip 30 has reached or fallen below the second reference temperature Ts2, e.g., 80° C., at which re-adsorption of oxygen O and carbon C to the second main surface 31 is prevented. This is the second checking step (step S8). After the plasma treatment, the semiconductor chip 30 having reached the second temperature T2, which is equal to or lower than the second reference temperature Ts2, is taken out of the plasma treatment unit 90, as illustrated in FIG. 11C.

The semiconductor chip 30 having a temperature equal to or lower than the second reference temperature Ts2 after being subjected to the plasma treatment under an inert gas atmosphere, i.e., the semiconductor chip 30 having undergone the second treatment step (step S7) and the second checking step (step S8) depicted in FIG. 9, is used in the subsequent chip placement step (step S3), first bonding step (step S4), preparatory step (step S5), and second bonding step (step S6) depicted in FIG. 9. In these chip placement step, first bonding step, preparatory step, and second bonding step, the conductive plate 10 having a temperature equal to or lower than the first reference temperature Ts' after being similarly subjected to plasma treatment under an inert gas atmosphere, i.e., the conductive plate 10 having undergone the first treatment step (step S1) and the first checking step (step S2) depicted in FIG. 9, is used as the conductive plate 10. The chip placement step, the first bonding step, the preparatory step, and the second bonding step are implemented in the same way as described above in the second embodiment in both cases of using either the paste-like sinter material 20 or sheet-like sinter material 20.

In the manufacturing method for the semiconductor device 1 according to the fourth embodiment, the adsorption amount of oxygen and carbon is controlled on either of the first main surface 11 of the conductive plate 10 or the second main surface 31 of the semiconductor chip 30 to be a certain amount or less, e.g., 20 atomic % or less, by plasma treatment under an inert gas atmosphere. This prevents a decrease in the adhesion of the sinter material 20 not only to the first main surface 11 of the conductive plate 10, but also to the second main surface 31 of the semiconductor chip 30. Herewith, it is further possible to minimize displacement of the semiconductor chip 30 during the preparatory step, including transportation, disposition of the protective sheet 70 and the like, performed between the temporary bonding and the definitive bonding.

In addition, in the manufacturing method for the semiconductor device 1 according to the fourth embodiment, the sinter material 20 after temporary bonding offers sufficient adhesion to the first main surface 11 of the conductive plate 10 and the second main surface 31 of the semiconductor chip 30. The temporary bonding is performed according to the above-described condition that specifies a relatively low heating temperature (e.g., in the range between 100° C. and 180° C., inclusive), a relatively low pressure (e.g., 5 MPa or lower) in a relatively short time (e.g., 10 seconds or less). Then, definitive bonding executed following the temporary bonding under such a condition is able to achieve sufficient sintering and bonding strength.

The manufacturing method for the semiconductor device 1 according to the fourth embodiment further effectively minimizes displacement of the semiconductor chip 30 caused by decreased adhesion of the sinter material 20. This prevents problems, for example, in connections between the semiconductor chip 30 after being bonded to the conductive plate 10 and other parts, which in turn enables high-quality semiconductor device 1 with good yield.

Note that the third and fourth embodiments above describe a case of performing heat treatment on both the conductive plate 10 and the semiconductor chip 30 under a reducing gas atmosphere (the third embodiment) and a case of performing plasma treatment on both the conductive plate 10 and the semiconductor chip 30 under an inert gas atmosphere (the fourth embodiment). Alternatively, it is possible to apply heat treatment to the conductive plate 10 under a reducing gas atmosphere while applying plasma treatment to the semiconductor chip 30 under an inert gas atmosphere. Still alternatively, it is possible to apply plasma treatment to the conductive plate 10 under an inert gas atmosphere while applying heat treatment to the semiconductor chip 30 under a reducing gas atmosphere.

According to one aspect, a manufacturing method for a semiconductor device is provided, which is capable of minimizing displacement of a semiconductor chip caused by decreased adhesion of a sinter material.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device manufacturing method, comprising:

a first treatment process for
  providing a conductive plate having oxygen and carbon adsorbed to a main surface thereof, and
  reducing an amount of the oxygen and the carbon adsorbed to the main surface of the conductive plate to 20 atomic % or less;

a first checking process for checking whether the conductive plate after the first treatment process has a temperature equal to or lower than a first reference temperature;

a chip placement process for placing, responsive to the conductive plate having the temperature equal to or lower than the first reference temperature in the first checking process, a semiconductor chip on the main surface of the conductive plate via a sinter material containing an organic substance, such that the main surface of the conductive plate opposes a main surface of the semiconductor chip;

a first bonding process for applying, after the chip placement process, heat and pressure to the sinter material according to a first condition that allows the organic substance to partially remain;

a preparatory process for making, after the first bonding process, preparations for further bonding the semiconductor chip to the first main surface via the sinter material; and a second bonding process for further applying, after the preparatory process, heat and pressure to the sinter material according to a second condition that sinters the sinter material.

2. The semiconductor device manufacturing method according to claim 1, wherein the first treatment process includes heat-treating the main surface of the conductive plate under a reducing gas atmosphere.

3. The semiconductor device manufacturing method according to claim 1, wherein the first treatment process includes plasma-treating the main surface of the conductive plate under an inert gas atmosphere.

4. The semiconductor device manufacturing method according to claim 1, wherein the first reference temperature is 80° C.

5. The semiconductor device manufacturing method according to claim 1, further comprising:

prior to the chip placement process, a second treatment process for
  providing the semiconductor chip having oxygen and carbon adsorbed to the main surface thereof, and
  reducing an amount of the oxygen and the carbon adsorbed to the main surface of the semiconductor chip to 20 atomic % or less; and a second checking process for checking, prior to the chip placement process, whether the semiconductor chip after the second treatment process has a temperature equal to or lower than a second reference temperature, wherein:

the chip placement process includes placing, responsive to the conductive plate having the temperature thereof equal to or lower than the first reference temperature in the first checking process and the semiconductor chip having the temperature thereof equal to or lower than the second reference temperature in the second checking process, the semiconductor chip on the main surface of the conductive plate via the sinter material such that the main surface of the conductive plate opposes the main surface of the semiconductor chip.

6. The semiconductor device manufacturing method according to claim 5, wherein the second treatment process includes heat-treating the main surface of the semiconductor chip under a reducing gas atmosphere.

7. The semiconductor device manufacturing method according to claim 5, wherein the second treatment process includes plasma-treating the main surface of the semiconductor chip under an inert gas atmosphere.

8. The semiconductor device manufacturing method according to claim 5, wherein the second reference temperature is 80° C.

9. The semiconductor device manufacturing method according to claim 1, wherein:

the chip placement process includes:

applying the sinter material in a form of a paste to the main surface of the conductive plate, and placing the semiconductor chip such that the main surface of the semiconductor chip opposes the sinter material applied to the main surface of the conductive plate.

10. The semiconductor device manufacturing method according to claim 1, wherein:

the chip placement process includes:

attaching the sinter material in a form of a sheet to the main surface of the semiconductor chip; and placing the semiconductor chip such that the main surface of the semiconductor chip to which the sinter material is attached opposes the main surface of the conductive plate.

11. The semiconductor device manufacturing method according to claim 1, wherein the preparatory process includes transporting the conductive plate with the main surface bonded to the semiconductor chip via the sinter material in the first bonding process.

12. The semiconductor device manufacturing method according to claim 1, wherein the preparatory process includes covering, with a protective sheet, the semiconductor chip that is bonded to the main surface of the conductive plate via the sinter material in the first bonding process.

13. The semiconductor device manufacturing method according to claim 1, wherein the semiconductor chip is provided in plurality;

the sinter material is provided in plurality; and the chip placement process includes individually placing each of the plurality of semiconductor chips on the main surface of the conductive plate via one of the plurality of sinter materials.

* * * * *